(12) United States Patent
Sri-Jayantha et al.

(10) Patent No.: US 8,047,421 B2
(45) Date of Patent: Nov. 1, 2011

(54) ELLIPTIC C4 WITH OPTIMAL ORIENTATION FOR ENHANCED RELIABILITY IN ELECTRONIC PACKAGES

(75) Inventors: Sri M. Sri-Jayantha, Ossining, NY (US); Lorenzo Valdevit, Ithaca, NY (US)

(73) Assignee: International Business Machines Coporation, Armonk, NY (US)

( * ) Notice: Subject to any disclaimer, the term of this patent is extended or adjusted under 35 U.S.C. 154(b) by 0 days.

(21) Appl. No.: 12/869,340

(22) Filed: Aug. 26, 2010

(65) Prior Publication Data

US 2011/0049711 A1 Mar. 3, 2011

Related U.S. Application Data

(62) Division of application No. 11/682,082, filed on Mar. 5, 2007, now Pat. No. 7,841,508.

(51) Int. Cl.
*B23K 31/02* (2006.01)

(52) U.S. Cl. ........... 228/180.21; 228/180.5; 228/180.22; 438/108; 361/820

(58) Field of Classification Search .............. 228/180.5, 228/180.21, 180.22; 257/459; 438/108, 438/614; 361/820, 767, 808
See application file for complete search history.

(56) References Cited

U.S. PATENT DOCUMENTS

| | | | | |
|---|---|---|---|---|
| 5,565,385 A * | 10/1996 | Rostoker et al. | ............... | 438/614 |
| 5,875,102 A * | 2/1999 | Barrow | ......................... | 361/777 |
| 5,917,702 A | 6/1999 | Barrow | | |
| 6,133,134 A * | 10/2000 | Mehr | ............................. | 438/612 |
| 6,541,857 B2 * | 4/2003 | Caletka et al. | ................. | 257/738 |
| 6,911,738 B2 * | 6/2005 | Leinbach | ....................... | 257/780 |
| 6,913,948 B2 | 7/2005 | Caletka et al. | | |

OTHER PUBLICATIONS

Kuo-Ning Chiang et al., Journal or Electronic Packaging, Jun. 2001, vol. 123, pp. 127-131.*
Kuo-Ning, Chiang, et al., entitled "A Comparison of Thermal Stress/Strain Behavior of Elliptical/Round Solder Pads", Journal of Electronic Packaging, Jun. 2001, vol. 123, pp. 127-131.

\* cited by examiner

*Primary Examiner* — Roy King
*Assistant Examiner* — Michael Aboagye
(74) *Attorney, Agent, or Firm* — Scully, Scott, Murphy & Presser, P.C.; Vazken Alexanian

(57) ABSTRACT

An arrangement for the equipping of electronic packages with elliptical C4 connects possessing optimal orientation for enhanced reliability. Furthermore, disclosed is a method providing elliptical C4 connects which possesses optimal orientation for enhanced reliability, as implemented in connection with their installation in electronic packages. Employed are essentially elliptical solder pads or elliptical C4 pad configurations at various preferably corner locations on a semiconductor chip.

7 Claims, 5 Drawing Sheets

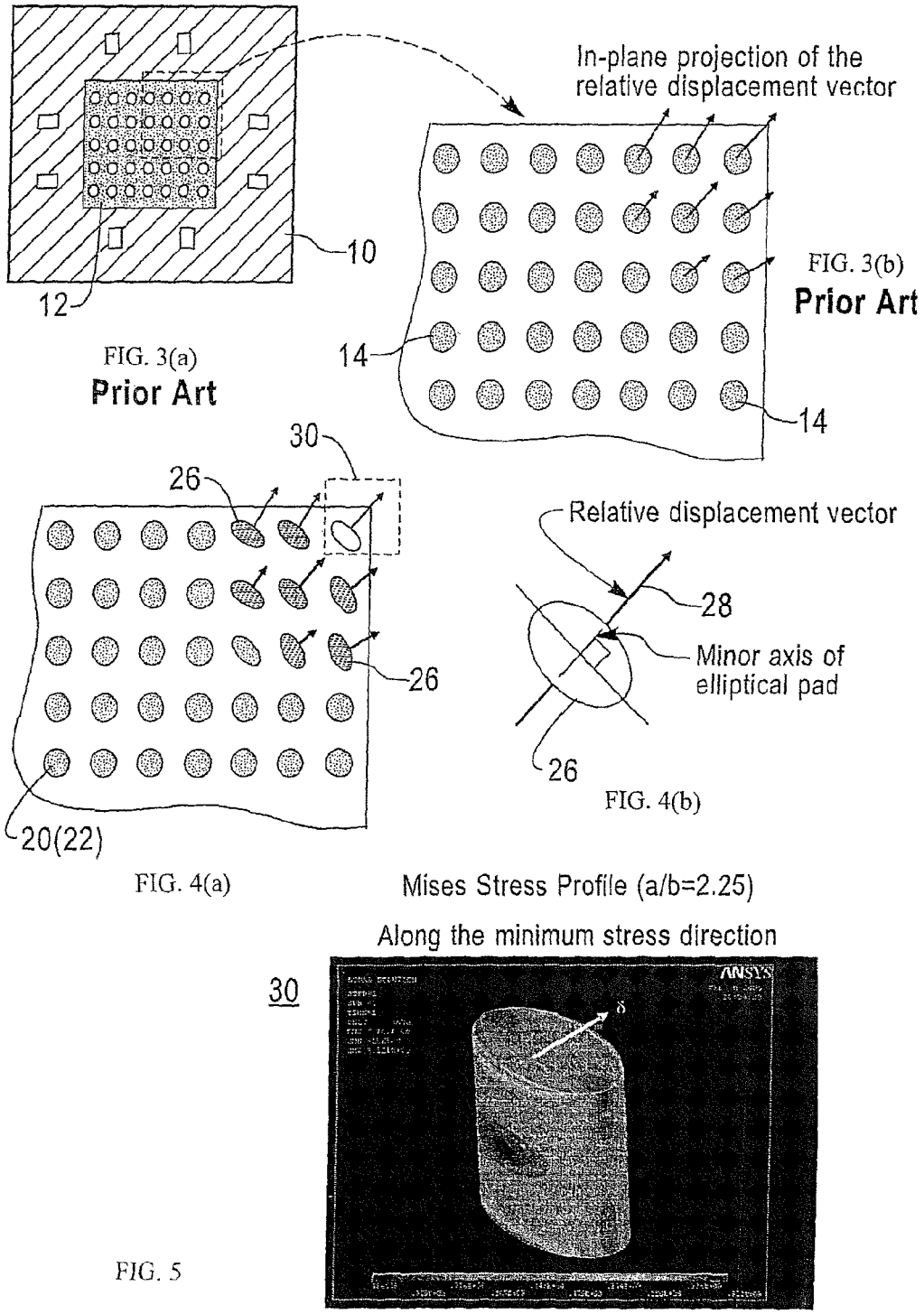

US 8,047,421 B2

ELLIPTIC C4 WITH OPTIMAL ORIENTATION FOR ENHANCED RELIABILITY IN ELECTRONIC PACKAGES

CROSS REFERENCE TO RELATED APPLICATIONS

This application is a divisional application of U.S. patent application Ser. No. 11/682,082, filed Mar. 5, 2007 now U.S. Pat. No. 7,841,508.

BACKGROUND OF THE INVENTION

1. Field of the Invention

The present invention relates to an arrangement for the equipping of electronic packages with elliptical C4 connects possessing optimal orientation for enhanced reliability. Furthermore, the invention is also directed to a method providing elliptical C4 connects which possesses optimal orientation for enhanced reliability, as implemented in connection with their installation in electronic packages.

An electronic package for a computer may be assembled by connecting a microprocessor chip, for instance, possessing typical dimensions of about 15×15 mm to a substrate of about 50×50 mm in size. The chip is typically made of silicon, whereas the substrate is most frequently constituted of a composite structure, having several layers of copper lines and planes embedded in a polymeric matrix, which is broadly referred to as "resin". The electrical connection between the microprocessor chip and the substrate is formed by an operatively guaranteed by an array of solder joints referred to as C4s (Controlled Collapse Chip Connections). Each C4 brazes or solders a metal pad on the bottom surface of the chip to a respective symmetrical pad, which is located on the top surface of the substrate, wherein the C4 brazing process is identified as the reflow. During reflow, the package and the C4s are subjected to a temperature which is higher than the melting point of the solder material (about 185° C.-230° C.); whereby a few minutes of exposure to this temperature range is typically adequate to achieve a good electrical and mechanical connection between the components. The resulting shape of the C4s, as described hereinbelow in more specific detail, is governed by the shape of the pads.

The solder material, which is normally constituted of tin/lead (Sn/Pb) or tin/silver/copper (Sn/Ag/Cu—SAC), is known to be subject to a finite fatigue life when subjected to a cyclical strain, whereby in the field, the cyclical strain encountered in the C4s is the result of thermal cycles sustained by the electronic package; in which the chip and substrate have different coefficients of thermal expansion (CTE), and upon being exposed to temperature variations, their respective materials deform differently, consequently shearing and destroying the C4s. In order to reduce the shear strain, which is applied to the C4s, a layer of an underfill material is added so as to bind the chip and the substrate following the first or initial reflow process. The underfill material significantly reduces the relative motion between the chip and the substrate surfaces, thereby forcing the overall assembly to bend. Bending stresses are much more benign than shear stresses for the C4 connects, which will result in an enhanced reliability and mechanical robustness or strength of the electronic package.

2. Discussion of the Prior Art

Pertaining to the present state-of-the-technology, this is elucidated on the basis of FIGS. 1(a) through 1(c) of the drawings, illustrative of silicon chips mounted on a substrate by employing current types of C4 connections.

A schematic of a silicon chip mounted on a substrate is depicted in FIG. 1(a) plan view; FIG. 1(b) in a cross-sectional view; and FIG. 1(c) in a close-up on one C4, shown enlarged, whereby the chip is connected to the substrate through the C4s. The circular shape of the pads, which are embedded in both the chip and the substrate represents a guarantee that the C4 will have two circular faces; whereby this aspect, together with the bulging profile deriving from the reflow process, imparts to the C4 a nearly spherical shape, as shown in FIG. 1(c). Hereby, a typical C4 may possess a diameter of about 120 μm at its center, and about 100 μm at the joints, with a height of about 100 μm. In a widely adopted industry standard ('4 on 8'), C4s with 100 μm pad diameter are distributed on a square grid with a pitch of 200 μm. The industry trend is to reduce the C4 diameter and distribution pitch so that the joint density necessary for high input/output (I/O) connections can be increased. As an example, the industry is also investigating the performance of micro-C4s with 25 μm diameter pads, 10-20 μm heights and a pitch of 50 μm.

The chip-substrate assembly has to survive not only temperature cycles in the field, but also standard deep thermal cycles (DTC) before shipment. Under both environments, the differential motion between the chip and the substrate induces a shear strain in the C4, as described hereinabove; concerning which, an encountered shear strain in excess of a threshold value (typically 0.1%) results in plastic deformation, whereby repetitive strain cycles with plastic deformation lead to a cumulative damaging process, which eventually culminates in fatigue failure of the C4s at a relatively low number of cycles, typically between 1000 to 2000. The C4s, which are located furthest from the chip's neutral point (distance from neutral point—DNP) undergo the largest strain during thermal cycling and are known to fail first, leading to the conclusion that an increase in chip size is bound to reduce the service life expectancy of a C4 chip joint.

The number of cycles to failure (N) at a given temperature is represented approximately by an empirical formula, motivated by Coffin/Manson about 50 years ago; as follows:

$$N = c/(\Delta e^n)$$

The constant c and exponent n (~2) are material-dependent, whereas Δe represents the plastic deformation encountered during a cycle. During most of the time in a DTC, the temperature of the solder is high enough for the C4s to creep. Inclusion of this effect results in a more complex formulation; however, the fundamental observation is that a reduction in plastic strain results in a substantial (non-linear) improvement in the number of cycles up to failure.

In particular, pursuant to the prior art, there is described a method of analyzing solder shapes after reflow, wherein problems are addressed with regard to comparison between elliptical and round solder pads. Hereby, this aspect is treated in an article by Kuo-Ning Chiang, et al., entitled "A Comparison of Thermal Stress/Strain Behavior of Elliptical/Round Solder Pads", Journal of Electronic Packaging, June 2001, Volume 123, Pages 127-131.

SUMMARY OF THE INVENTION

In order to obviate or ameliorate the drawbacks and limitations, which are encountered in the prior art by particularly utilizing round C4 connections or, in effect, round solder pads, the invention is accordingly directed to employing essentially elliptical solder pads or elliptical C4 pad configurations at various locations on a semiconductor chip.

The conventional C4-pad shape is circular and in applications thereof, the resulting nearly-spherical C4 is normally not sensitive to the direction of shear. However, electronic packages have a proclivity for a preferred direction for deformation, typically along the radial direction from the center of a chip. Exploiting the specific pattern of the deformation, the present invention uniquely employs an elliptic-C4 configuration in order to enhance the fatigue life thereof without compromising the electrical performance of an electronic package. It has been demonstrated that for a given cross sectional area of the pad, an elliptic foot print with an optimal orientation produces a lower strain and strain energy for a given relative deformation. The orientation of the minor axis of the elliptic pads must be aligned with the in-plane projection of the relative motion of the top and bottom pad. An elliptic pad not only increases the fatigue limit but also reduces the current density within the solder, resulting in a substantial mitigation of any encountered damage caused by electromigration.

Accordingly, it is an object of the present invention to provide a method of equipping electronic packages with elliptical C4 connects at optimum orientations for enhanced reliability thereof.

Another object of the invention resides in the provision of an arrangement for the equipping of electronic packages with elliptical C4 connects possessing optimal orientations for enhanced reliability.

BRIEF DESCRIPTION OF THE DRAWINGS

Reference may now be made to the following detailed description of preferred embodiments of the invention, taken in conjunction with the accompanying drawings; in which:

FIG. 3a illustrates an array of C4s on a substrate pursuant to the prior art, including an enlarged fragmentary representation thereof in FIG. 3b;

FIGS. 4a and 4b illustrate, respectively, a fragmentary portion of elliptical pads and an enlarged segment of an elliptical pad;

FIG. 5 illustrates a diagrammatic example of an elliptical C4 subjected to shear strain along a minor axis;

DETAILED DESCRIPTION OF THE INVENTION

Figure 1A:
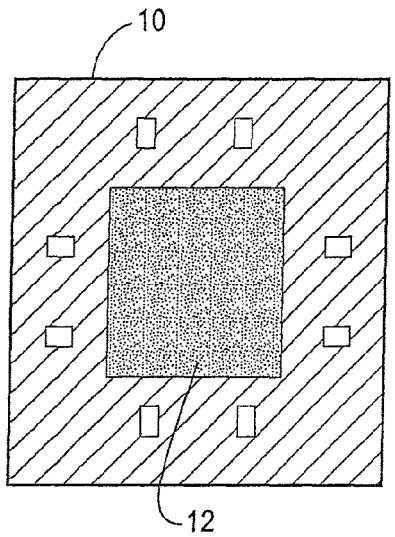
FIGS. 1a through 1c illustrate, respectively, various aspects of circular C4 connections or solder pads pursuant to the state of the art.
Figure 1B:
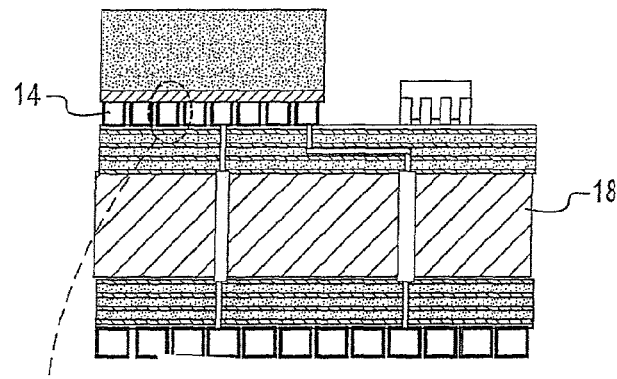
Figure 1C:
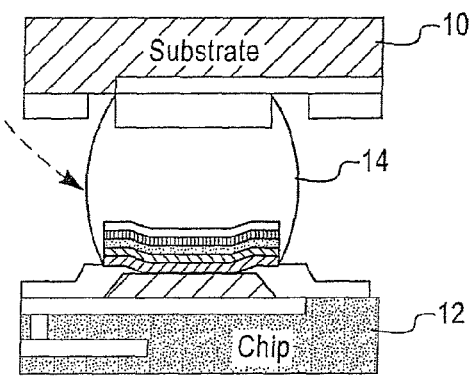

As shown in FIG. 1a of the drawings, there is represented a substrate 10 having a semiconductor chip 12 of an electronic package located thereon. The semiconductor chip 12 in this structure, as presently employed in the technology, utilizes essentially round ball-shaped solder balls 14 (of which one is illustrated) on an enlarged scale in FIG. 1c, from the encircled part A in FIG. 1b, which produces a C4 connection. All of the electronic package components, including the printed circuit board 18, are known in the state-of-the-art, as mentioned hereinabove.

Figure 2A:
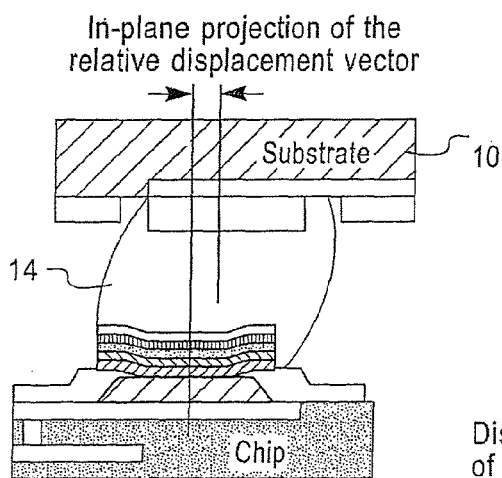
FIGS. 2a and 2b illustrate essentially displacement vector conditions of a C4 connection, pursuant to the prior art.
Figure 2B:
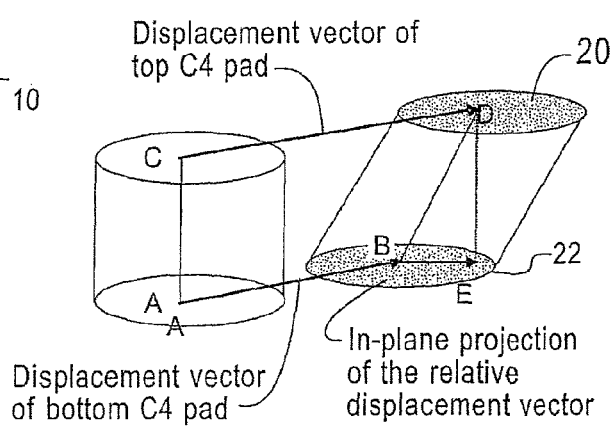

Referring in further detail to the drawings, as illustrated herein, FIG. 2a shows a deformed state of the C4 connection 14 due to the relative motion of the upper and lower C4 pads 20, 22. The arrow shown on top of the substrate 10 represents the vector of relative motion. FIG. 2b shows a generalized displacement pattern of the C4 connection in a three-dimensional representation. Hereby, AB and CD represent the displacement vectors of the top and bottom pads 20, 22. The in-plane relative motion of the circular pads 20, 22 is given by the vector BE. Thus, the vector BE is the in-plane projection of the relative pad motion (referred to as relative motion vector). In this representation, the pads 20, 22 are assumed to be arranged in parallel relative to each other.

FIGS. 3a and 3b show an array of C4s 14 on a substrate 10 as currently employed in prior art, together with the typical direction of motion thereof during a thermal cycle. In this diagrammatic representation, the relative motion or displacement vector is assumed to be directed along the radial direction in an in-plane projection. A detailed analysis of a specified electronic package may indicate that the direction of motion can be closely projected before an electronic package is actually prototyped or manufactured.

Referring to FIG. 4a of the drawings, this elucidates the concept of the present invention. The previously disclosed circular pads 20, 22 are now modified into elliptical pads 26 and the minor axis 28 of each pad 26 is set parallel to the relative motion or displacement vector, as shown in FIG. 4b. An identical grid structure is deployed, as in FIGS. 3a and 3b, indicative that the pitch of the elliptic-C4 is the same as that of the circular-C4. The mode of implementation as shown in FIG. 4a consists of depositing only a limited number of elliptical-shape C4s 30 near the corner of a substrate 10, while maintaining the spherical shape of C4s 14 for all the remaining ones.

The C4s 30 carry signals and voltages to transistors (not shown) embedded in the semiconductor chip 12, whereby it can be shown that an elliptical C4 30 may enhance resistance to electromigration. Therefore, currently carrying C4s that are prone to electromigration can be made of elliptical C4 30, while others can be left as circular C4s 14 in the event that fatigue is not a concern, this can then be a second mode of implementation of the invention.

A combination of first and second mode in these configurations of the C4 connects is optimal for a semiconductor chip that is prone to fatigue as well as to electromigration problems.

Figure 6:
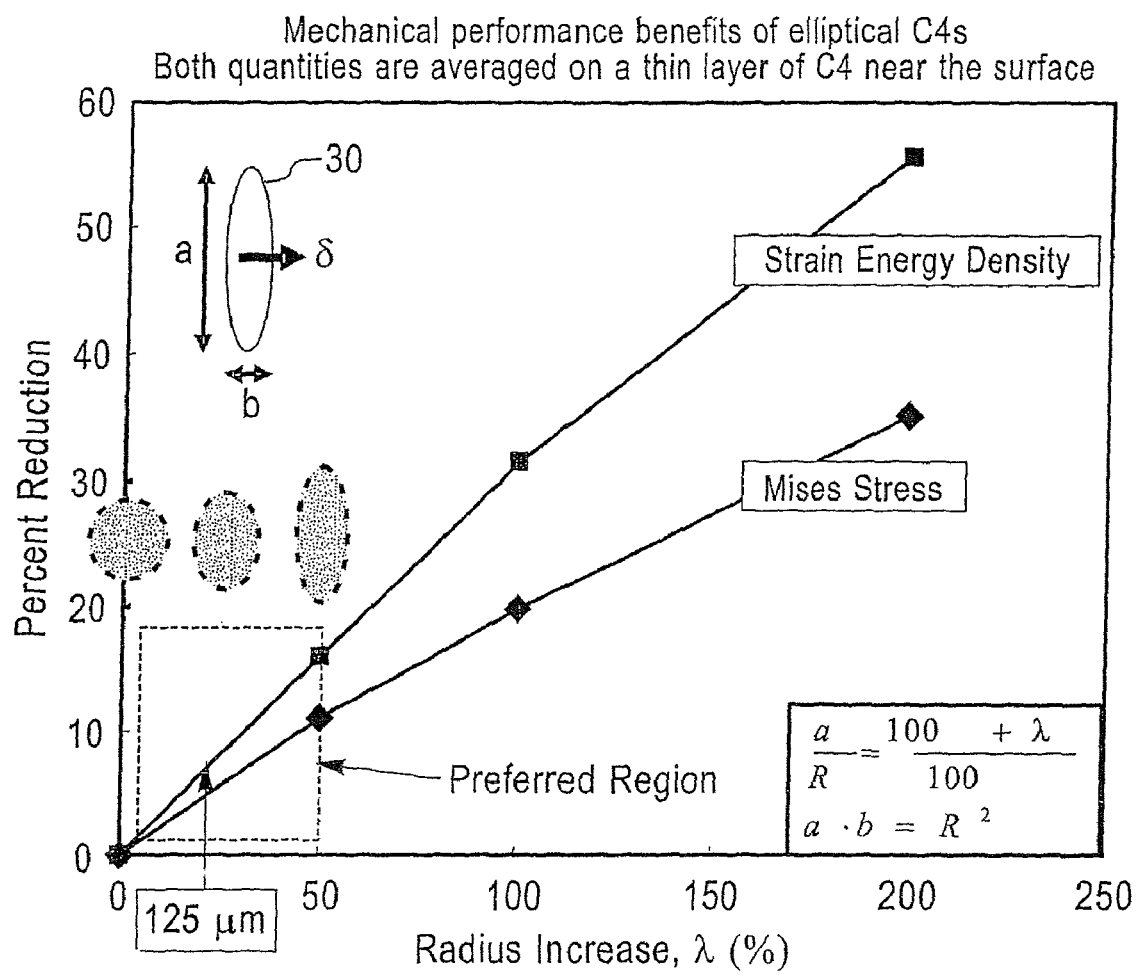
FIG. 6 illustrates the mechanical performance benefits of elliptical C4s, as shown in a graphical representation.

FIG. 5 shows an example of an elliptical C4 30, which is subjected to shear strain along the minor axis thereof. The aspect ratio of the C4 elliptical cross-section (major axis/minor axis) is 2.25, obtained from a circular shape by stretching the radius by 50% along one direction and reducing the radius in the perpendicular direction by 33%—so that the overall surface area is maintained. The computed von Mises stresses are maximum near the edge of the pads. FIG. 6 shows the effect of the relative increase of the major axis on strain energy and von Mises stress. Both quantities have been obtained by averaging the FE results on a slice of the C4 close to a pad (thickness of the slice=7 μm). It is noted that an elliptical C4 with a 125 μm major axis, when loaded along its minor axis, reduces the strain energy by 10% with respect to its spherical C4 counterpart of equal cross sectional area. It is emphasized that these estimates are based on linear elastic analyses, whereas the C4s are well-known to undergo plastic deformations upon thermal cycling conditions (both in the field and under DTC). However, reductions in the elastic stresses (and strain energy) prior to yielding translate to benefits in the plastic strains and energies, and consequently impart enhancements in the fatigue life of the electronic components.

Unlike their spherical counterparts, C4s based on elliptical cross-sections are not isotropic, meaning that any miscalculation or uncertainty in the gradient vector will inevitably raise stresses and energies above the predicted level. In order for the proposed approach to be convenient, it needs to be robust, signifying that realistically possible miscalculations must not transform the benefit into a disadvantage.

Figure 7:
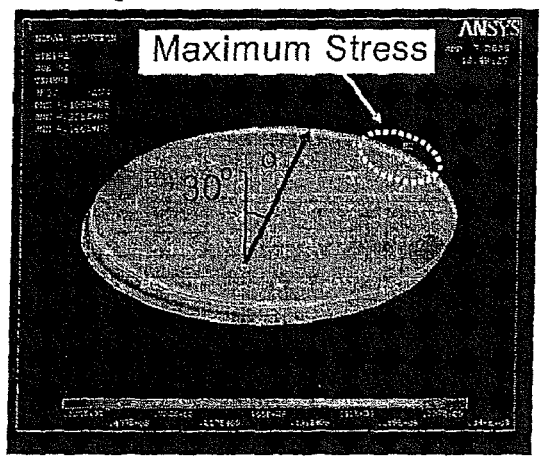
FIG. 7 illustrates the effects of the misorientation of an elliptical C4 from the ideal position thereof.
Figure 8:
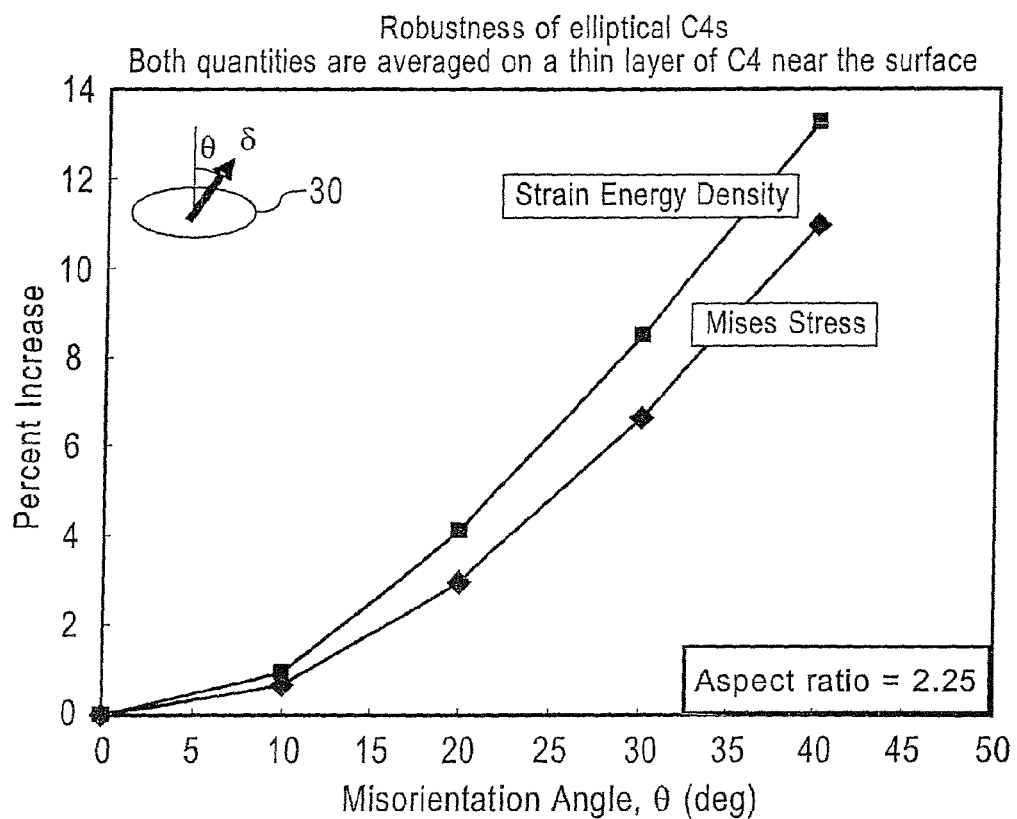
FIG. 8 illustrates the graphical representation of the effects of misorientation on stresses and energy acting on the elliptical C4s.

FIG. 7 illustrates the effect of misorientation of an elliptic-C4 from its ideal position. The location and magnitude of the peak value changes, whereas FIG. 8 depicts the effect of misorientation on stresses and energy. Hereby, it is notable that for the same aspect ratio as in FIG. 6, a miscalculation of 20% (quite severe) in the gradient vector only causes stresses and energy increases of less than 4%. In other words, the benefit gained in choosing C4s 30 of elliptical cross section is reduced, but is not eliminated, or even worse turned into a potential disadvantage.

Surviving industry standard DTC cycle is many times more challenging than surviving a customer "use condition." The DTC cycle subjects a whole electronic package to same temperature condition in which the differential displacement vector (DDV) has a cohesive directions response.

Figure 9:
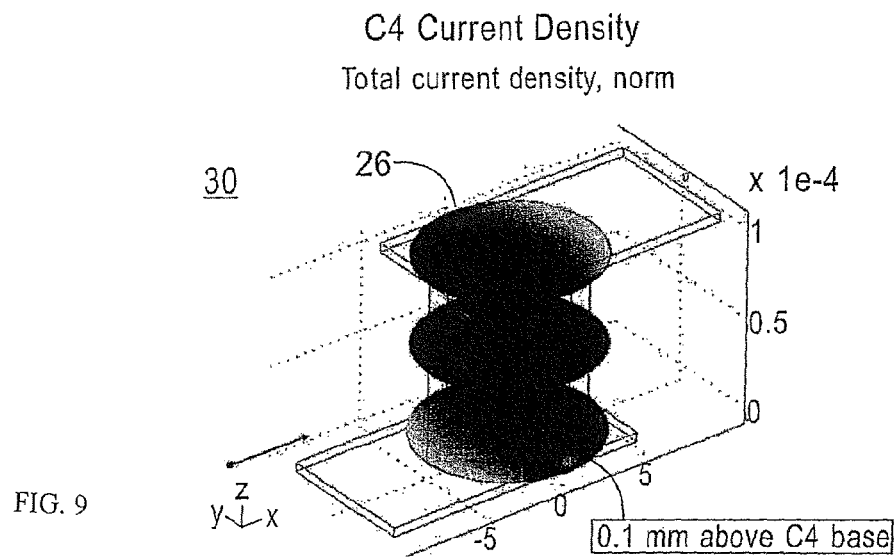
FIG. 9 illustrates a diagrammatic current density distribution through a C4 in three representations thereof.
Figures 10A, 10B:
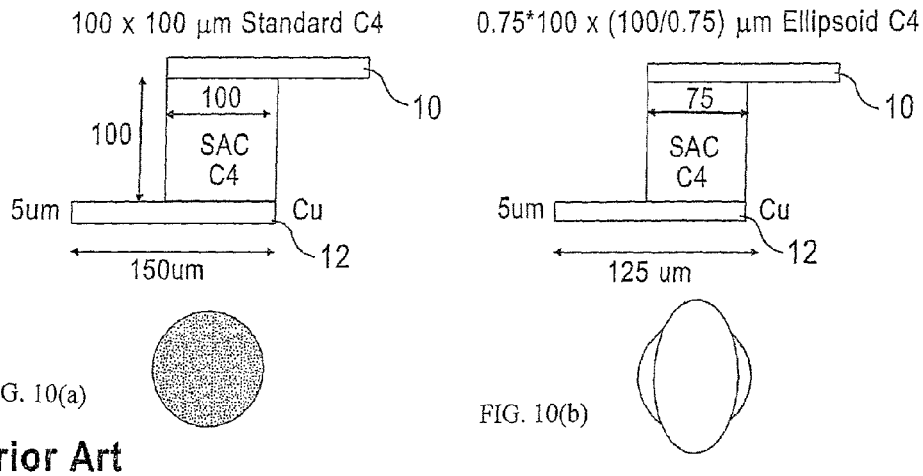
FIGS. 10a and 10b illustrate, respectively, schematic representation of the dimensions for, respectively, a circular and an elliptical C4 connect.
Figures 11A, 11B:
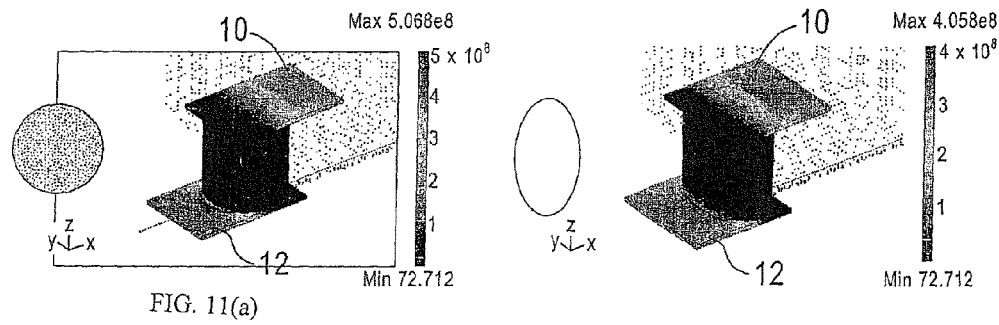
FIGS. 11a and 11b illustrate, respectively, the electrical current density distribution through C4s.
Figure 12:
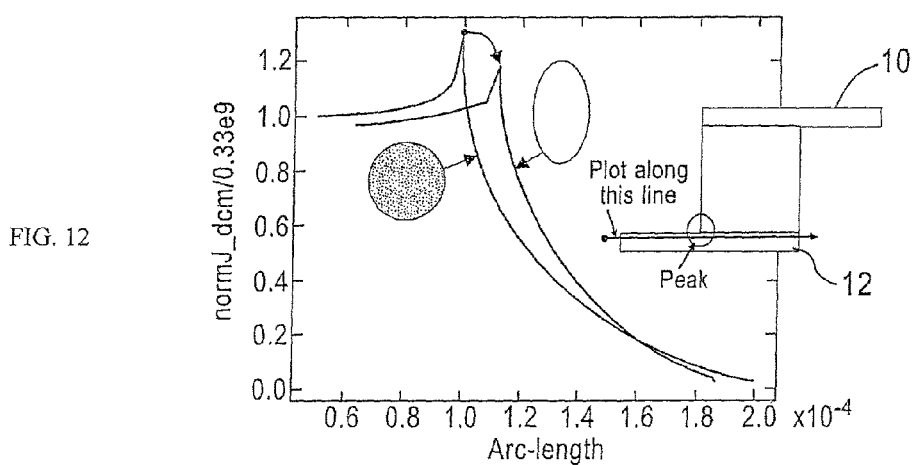
FIG. 12 illustrates a normalized comparative plot of electrical current density passing through C4 connections.

FIG. 9 represents a depiction of a current density distribution through a C4 connection in three elevational locations, whereby there can be observed that the electrical current density peaks along the pad edges. FIGS. 10a and 10b show a schematic representation of the dimensions used for, respectively, a circular and an elliptical C4. FIGS. 11a and 11b show the current density distribution when a 200 mA current is driven through the circular and elliptical C4s wherein the elliptical C4s provide a longer edge for the electrical current to be distributed, and to thereby reduce the peak magnitude commensurately. Finally, FIG. 12 discloses a normalized comparative plot of current density. There is obtained a 10% decrease in peak electrical current density for an aspect ratio of 1.65, as used in this example.

The foregoing clearly indicates the advantages obtained over standard spherical C4s through the use of C4s with elliptical pads.

In conclusion, C4s with elliptical pads, when oriented along an optimal path, possess the following advantages over the industry standard spherical C4s:

(i) an increased fatigue life, which is achieved due to a reduced stressed level under the same thermal cycle conditions; and (ii) a reduced sensitivity to electromigration damage, due to an obtained reduction in the peak current density.

An implementation of the invention consists of using elliptical C4s in the semiconductor chip areas subjected to a maximum strain (i.e., normally near the corner region of the chip), with the minor axis of the C4 pad aligned with the relative displacement vector (i.e., roughly along the radial direction from the center of the chip); similarly, the C4s that receive the highest currents should be elliptical, with the minor axis aligned with the horizontal lines feeding power to a C4.

It is important to emphasize that the above-mentioned approach does not require any new manufacturing process; only needed is the depositing of elliptical pads on both the semiconductor chip and the substrate, and the C4s will assume the desired shape during the reflow process to which they are subjected.

The advantage of the elliptical geometry can be applied to all electrical or non-electrical components that require attachment, using fatigue prone material.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. An arrangement in an electronic package providing for electrical interconnects between a substrate and a semiconductor chip, comprising:

an array of C4 solder joints, each respectively connecting a metal pad on a surface of said substrate with a symmetrical metal pad located oppositely thereof on the surface of said semiconductor chip, so as to form said interconnect, wherein at least a portion of the array of C4 solder joints has oppositely facing metal pads on said substrate and semiconductor chip which are a conformant elliptical configuration; and a remaining portion of the array of C4 solder joints are non-elliptical metal pads on said substrate and said semiconductor chip and are essentially of round or circular configurations, wherein said substrate and said semiconductor chip are each substantially rectangular, and said facing elliptical metal pads on said substrate and semiconductor chip are located proximate corner regions of said semiconductor chip;

said elliptical metal pads having minor axes, respectively, generally aligned along radial directions from a center of said facing semiconductor chip towards a respectively therewith associated corner region of said semiconductor chip;

the minor axes of the elliptical metal pads on said substrate and semiconductor chip extend in parallel with a relative motion vector encountered between the metal pads on said substrate and the facing metal pads on said semiconductor chip responsive to reflow and operation of said electronic package.

2. An arrangement as claimed in claim 1, wherein said C4 solder joints comprise initially spherical solder balls located between and contacting associated facing metal pads on said substrate and semiconductor chip, said solder balls assuming a shape of said metal pads during high-temperature reflow brazing of said components and producing mechanical and electrical connections between the substrate and the semiconductor chip, wherein the shape of said metal pads is either the conformant elliptical configuration or a non-elliptical configuration.

3. An arrangement as claimed in claim 2, wherein initially spherical solder balls which are located between the elliptical metal pads on said substrate and semiconductor chip are permanently deformed into substantially elliptical configurations in conformance with said metal pads during reflow thereof.

4. An arrangement as claimed in claim 3, wherein an identical grid array pattern is maintained for said round and for said elliptical metal pads on the substrate and semiconductor chip surfaces.

5. An arrangement as claimed in claim 3, wherein said deformed substantially elliptical C4 solder connects are subject to lower stresses and strains in regions of maximum strain encountered in the corner regions of said semiconductor chip.

6. An arrangement as claimed in claim 1, wherein said C4 solder joints are selected from the group of materials consisting of tin/lead (Sn/Pb) and tin/silver copper (Sn/Ag/Cu) alloys.

7. An arrangement as claimed in claim 3, wherein a dielectric underfill material layer is interposed between said substrate and said semiconductor chip so as to mitigate strains encountered by said C4 solder joints.

* * * * *